(12) United States Patent
Paldus et al.

(10) Patent No.: US 6,970,484 B2
(45) Date of Patent: Nov. 29, 2005

(54) LASER TUNING BY SPECTRALLY DEPENDENT SPATIAL FILTERING

(75) Inventors: Barbara Paldus, Sunnyvale, CA (US); Jinchun Xie, Cupertino, CA (US); Robert Lodenkamper, Sunnyvale, CA (US); David M. Adams, Ottawa (CA); Eric Crosson, San Jose, CA (US); Alexander Katchanov, Sunnyvale, CA (US); Grzegorz Pakulski, Woodlawn (CA); Chris W. Rella, Sunnyvalve, CA (US); Bruce A. Richman, Sunnyvale, CA (US)

(73) Assignee: Picarro, Inc., Sunnyvale, CA (US)

( * ) Notice: Subject to any disclaimer, the term of this patent is extended or adjusted under 35 U.S.C. 154(b) by 0 days.

(21) Appl. No.: 11/106,000

(22) Filed: Apr. 13, 2005

(65) Prior Publication Data

US 2005/0175045 A1  Aug. 11, 2005

Related U.S. Application Data

(63) Continuation of application No. 10/308,541, filed on Dec. 2, 2002, which is a continuation-in-part of application No. 10/086,283, filed on Feb. 28, 2002, now abandoned.

(51) Int. Cl.[7] .................................................. H01S 3/10
(52) U.S. Cl. .......................................... 372/20; 372/19
(58) Field of Search ........................ 372/28, 29.01–33, 372/108, 20, 19, 13, 32, 25; 359/308

(56) References Cited

U.S. PATENT DOCUMENTS

| | | | |
|---|---|---|---|
| 4,118,675 A | 10/1978 | Rahn et al. | |
| 4,945,539 A * | 7/1990 | Bagshaw et al. | 372/13 |
| 5,189,676 A | 2/1993 | Wysocki et al. | |
| 5,255,274 A | 10/1993 | Wysocki et al. | |
| 5,329,397 A | 7/1994 | Chang | |
| 5,384,799 A | 1/1995 | Osterwalder | |
| 5,452,314 A * | 9/1995 | Aronson | 372/20 |
| 5,724,373 A * | 3/1998 | Chang | 372/20 |
| 5,812,567 A | 9/1998 | Jeon et al. | |
| 5,835,512 A | 11/1998 | Wada et al. | |
| 6,031,852 A * | 2/2000 | Thompson et al. | 372/20 |

FOREIGN PATENT DOCUMENTS

| | | |
|---|---|---|
| GB | 2153137 | 8/1985 |
| GB | 2207799 | 2/1989 |

OTHER PUBLICATIONS

Coquin et al., "Electronically Tunable External-Cavity Semiconductor Laser," Electronics Letters, vol. 24 (10), May 1988, pp. 599-600.
Zorabedian, "Tuning Fidelity of Acoustooptically Controlled External Cavity Semiconductor Lasers," IEEE J. Lightwave Technology, vol. 13 (1), Jan. 1995, pp. 62-66.
Koh et al., "Widely Tunable Hybrid Semiconductor Lasers," Proc. SPIE, vol. 3631, Jan. 1999, pp. 98-107.
Taylor et al., "Electronic Tuning of a Dye Laser Using the Acousto-Optic Filter," Applied Physics Letters, vol. 17 (8), Oct. 1970, pp. 335-337.

(Continued)

Primary Examiner—Minsun Oh Harvey
Assistant Examiner—Tuan N. Nguyen
(74) Attorney, Agent, or Firm—Lumen Intellectual Property Services Inc.

(57) ABSTRACT

A tunable laser and laser tuning method, based on the interaction of a spectrally dependent beam distortion and a spatial filter within a laser cavity. One embodiment of this laser is an external cavity semiconductor laser in which broad tunability is obtained by the insertion of an acousto-optic tunable filter (AOTF) into the laser cavity such that the intra-cavity laser beam passes through the AOTF in zeroth order.

26 Claims, 7 Drawing Sheets

OTHER PUBLICATIONS

Streifer et al., "Analysis of a Kye Laser Tuned by Acousto-Optic Filter," Applied physics Letters, vol. 17 (8), Oct. 1970, pp. 335-337.

Hutcheson et al., "Electronic Tuning of a Dye Laser with Simultaneous Multiple-Wavelength Output," IEEE J. of Quantum Electronics, Apr. 1974, pp. 462-463.

* cited by examiner

LASER TUNING BY SPECTRALLY DEPENDENT SPATIAL FILTERING

CROSS REFERENCE TO RELATED APPLICATIONS

This application is a continuation of application Ser. No. 10/308,541, filed on Dec. 2, 2002 and entitled "Laser Tuning by Spectrally Dependent Spatial Filtering". application Ser. No. 10/308,541 is a continuation-in-part of application Ser. No. 10/086,283 filed Feb. 28, 2002 now abandoned and entitled "Laser Tuning by Spectrally Dependent Spatial Filtering".

FIELD OF THE INVENTION

This invention relates to tunable lasers, and also provides a novel laser tuning mechanism.

BACKGROUND OF THE INVENTION

A) Background: Lasers

A laser consists of a pumped gain medium placed within an optical resonator. The pumped gain medium provides light amplification, and the optical resonator provides optical feedback, such that light can circulate within the optical resonator and be amplified by the gain element repeatedly. The gain medium can be pumped in various ways to provide optical amplification, including but not limited to electrical pumping and optical pumping. If the round trip loss within the optical resonator is less than the round trip gain provided by the gain element, the optical power increases on each round trip around the cavity. Since the amplification provided by the gain element decreases as the circulating optical power increases (an effect referred to as gain saturation), the steady state circulating power is the power required to make the round trip gain equal to the round trip loss. One of the elements within the optical resonator acts as the output coupler, where a certain fraction of the circulating power is emitted from the optical resonator, and constitutes the useful laser output. A partially transmitting mirror is a typical output coupler. It is frequently useful, for laser control, to provide one or more secondary output couplers in the optical resonator, where a small fraction of the circulating optical power is emitted from the secondary output coupler(s) in such a way as to be easily separated from the useful laser output.

An especially relevant laser for the present invention is an external cavity semiconductor laser. In such a laser, the gain medium is typically an electrically pumped single-mode optical waveguide. This waveguide has finite length, so it is terminated by two endfaces. Any semiconductor laser where the defining mirrors of the optical resonator are not the two endfaces of the gain medium waveguide is called an external cavity semiconductor laser, since in the course of a round trip, light leaves the gain element waveguide and reenters it. An optical beam emitted from an endface of a single-mode optical waveguide always has a characteristic amplitude and phase profile, referred to as the mode profile. This beam then propagates through the external cavity elements (i.e. everything except the gain element, usually), and returns to the gain element waveguide. It is convenient to define the "external cavity" as comprising all optical elements the beam encounters from the time it leaves the gain element waveguide to the time it returns to impinge on the waveguide endface. Frequently, the external cavity consists of a sequence of transmissive optical elements terminated by a mirror, called the return mirror, which retroreflects the optical beam back through the sequence of transmissive optical elements to impinge on the endface of the gain medium waveguide. The amplitude and phase profile of the return beam is generally not exactly the same as the mode profile, and in such cases, not all of the return beam power is launched (i.e. coupled) into the gain element waveguide. For example, if a certain power $P_b$ impinges on the waveguide endface, only some lesser amount of power $P_o$ is launched into the waveguide. The coupling efficiency $\eta = P_o/P_b$ depends on how close the return beam amplitude and phase profile is to the mode profile. We refer to loss due to launch inefficiency as mode mismatching loss.

The emission wavelength of the laser is determined by the wavelength dependence of the round trip loss and the round trip gain. If the gain medium provides amplification over a wide wavelength range, and is homogeneously broadened, then the emission wavelength of the laser will be largely determined by the wavelength at which the round trip loss in the resonator is minimized. A gain medium is homogeneously broadened if gain saturation reduces the optical gain at all wavelengths, and is inhomogeneously broadened if gain saturation only reduces the optical gain at or near the wavelength of the saturating optical beam. Thus, the most common way to make a tunable laser is to insert optical element(s) within the cavity to create a tunable intracavity bandpass filter. Since a bandpass filter has low loss for a narrow range of optical wavelengths centered about some center wavelength $\lambda_c$, and high loss for wavelengths outside this range, such a filter will tune the laser emission wavelength.

B) Background: Acousto-optic Devices

While many kinds of devices have been used as tuning elements within lasers, the use of acousto-optic (AO) devices as laser tuning elements is most relevant for the present invention. Acousto-optic devices are described in textbooks such as J. Xu and R. Stroud, *Acousto-Optic Devices: Principles, Design and Applications*, Wiley, New York, 1992. For our purposes it is sufficient to define an AO device as any device where the AO interaction is manifested. The AO interaction is a parametric three wave mixing process where an incident optical beam and an acoustic wave interact to generate a second optical wave, with an efficiency that primarily depends on the incident optical wavelength and the acoustic frequency. We refer to the second optical wave that is generated as the first order beam, or diffracted beam; and we refer to that portion of the incident beam that is not converted to the first order beam and exits the device as the zeroth order beam, or undiffracted beam. The zeroth and first order beams may always be distinguished, since the optical frequency of the zeroth order beam is the same as the incident optical frequency, while the optical frequency of the first order beam is larger or smaller than the incident optical frequency by an amount equal to the acoustic frequency. We refer to this effect as the "frequency shift" of the first order beam. The zeroth and first order beams may also differ in other ways, such as propagating in different directions, or having different states of polarization. The acoustic wave in an AO device is typically generated by a transducer bonded to a surface of the AO device, where applied electrical power at a suitable RF frequency acts to launch an acoustic wave of the same frequency into the AO device.

Since the AO interaction is a parametric three wave mixing process, the incident optical beam is efficiently converted to the diffracted beam only for a narrow range of incident optical wavelengths, centered about some center wavelength $\lambda_c$ at which the phase matching condition is met. The center wavelength $\lambda_c$ of the AO interaction can be changed by changing the RF frequency applied to the AO device. Therefore, if we regard an AO device as an optical three port device, with one input and two outputs (zeroth order and first order), then transmission from input to first order output (first order transmission) gives a tunable bandpass filter, and transmission from input to zeroth order output (zeroth order transmission) gives the corresponding tunable notch filter (i.e. high loss for a narrow range of optical wavelengths centered about some center wavelength $\lambda_c$, and low loss for wavelengths outside this range). Although many different AO devices are shown in the literature, such as AO tunable filters (AOTF), AO deflectors and AO modulators, this general description (i.e. bandpass filter in first order transmission and notch filter in zeroth order transmission) is applicable to all AO devices.

C) Background: Acousto-optic Laser Tuning Elements

A preferred embodiment of the present invention entails the use of an AOTF in zeroth order transmission to tune an external cavity semiconductor laser. We refer to the resulting laser as a "zeroth order AOTF laser". The novelty and nonobvious nature of the zeroth order AOTF laser is best appreciated by briefly reviewing the use of AO devices to tune lasers.

Acousto-optic devices were first used to tune dye lasers [e.g. as described in Streifer et al., Applied Physics Letters 17(8) p335 1970; Taylor et al., Applied Physics Letters 19(8) p269 1971; Hutcheson et al., IEEE Journal of Quantum Electronics, p 462 April 1974]. Subsequently, AO devices were used to tune other lasers where the gain medium has a broad bandwidth, such as fiber lasers [U.S. Pat. No. 5,189, 676 Wysocki et al; U.S. Pat. No. 5,255,274 Wysocki et al; U.S. Pat. No. 5,812,567 Jeon et al], semiconductor lasers [Coquin et al., Electronics Letters 24(10) p599 1988; Koh et al., Proc. SPIE v3631 p98 1999; Zorabedian, IEEE Journal of Lightwave Technology 13(1) p62 1995], and titanium-doped sapphire lasers [U.S. Pat. No. 5,835,512 Wada et al 1998]. In addition, there are several reports in the patent literature where general methods of tuning a laser with an AO device are disclosed, such as [U.S. Pat. No. 4,118,675 Rahn et al 1978] where the AO device acts as a beam deflector and dispersive element simultaneously to force oscillation at a desired wavelength. GB 2,153,137 Hall et al. 1985, discloses the use of an AO beam deflector and separate dispersive element to tune a laser. In U.S. Pat. No. 5,724, 373, Chang 1998, discloses a method for AO laser tuning where the AO interaction provides a waveguide mode conversion device, and narrowband filtering is obtained by use of this AO device in combination with appropriate polarization optics within the laser cavity.

In all of the references cited above, the AO device functions as a bandpass filter within the laser cavity, either independently, such as in the cases where the device is an AO device operating in first order transmission, or in combination with one or more intracavity optical elements, such as the combination of an AO mode converter with polarizers, or the combination of an AO beam deflector with the cavity round trip consistency condition to provide frequency selective feedback. In all the above cited references the diffracted (i.e. first order, deflected or mode converted) beam is of primary importance for the tuning mechanism, and the undiffracted (i.e. zeroth order, undeflected or non-mode converted) beam is not utilized by the tuning mechanism. All of these references teach the use of an AO device in first order transmission to tune a laser, and none teach a the use of an AO device in zeroth order transmission to tune a laser.

Since first order transmission through an AO device entails a frequency shift, much of the prior art cited above is concerned with the effect of the uncompensated frequency shift on laser operation, and/or on various methods of compensating for the frequency shift so as to eliminate its effect on laser operation.

One reference teaches the use of other than the first order beam (although not the zeroth order beam) in an AO interaction to tune a laser. U.S. Pat. No. 5,384,799 to Osterwalder (1995) discloses the formation of a periodic refractive index perturbation within an AO device due to a standing acoustic wave. Osterwalder further discloses a tunable narrowband feedback mechanism into the laser cavity, based on the narrowband reflection created by the disclosed periodic refractive index perturbation. A zeroth order AOTF laser is not taught by Osterwalder.

A fundamental difference between a zeroth order AOTF laser and the laser of Osterwalder is that Osterwalder teaches the presence of a narrowband back reflection from an acousto-optic device. No such back reflection is observed from an AO device in zeroth order transmission in experiments designed specifically to manifest this effect. Furthermore, coupled mode theory, a recognized theoretical approach for analyzing acousto-optic interactions that is well known to those skilled in the art, categorically predicts no narrowband back reflection from an AO device in zeroth order transmission.

There are additional significant differences between the teachings of Osterwalder and the zeroth order AOTF laser. Osterwalder teaches the use of a standing acoustic wave to create the disclosed refractive index perturbation. In contrast, an AO device in zeroth order transmission is driven by a traveling acoustic wave. Osterwalder teaches the importance of a collinear alignment of optical and acoustic wave vectors. In contrast, an AO device in zeroth order transmission can be based on a non-collinear phase matching geometry (e.g. as disclosed in U.S. Pat. No. 5,329,397). Osterwalder discloses a configuration with a waveguide AO device. In contrast, an AO device in zeroth order transmission is not a waveguide device.

In fact, the zeroth order AOTF laser is a preferred embodiment of a novel, nonobvious, and more general laser tuning mechanism we have discovered, which is referred to herein as "spectrally dependent spatial filtering" (SDSF). Various specific embodiments of the SDSF mechanism, using different gain media and/or different tuning elements, may be preferable in certain applications. Possible gain media include, but are not limited to, Erbium-doped optical fiber and electrically pumped semiconductor gain media. Possible tuning elements include, but are not limited to, volume hologram devices, and non-AO three wave parametric interaction devices, such as electro-optic devices. Note that the AO interaction is one example of a three wave parametric interaction. Suitable control inputs for volume holograms and/or three wave parametric devices include electrical frequencies and/or voltages.

In general, tunable diffractive optical elements operating in "zeroth order" (i.e. based on the use of the undiffracted beam) are regarded as suitable tuning elements for the SDSF mechanism, and are referred to as SDSF tuning elements. In transmission through an SDSF tuning element, the total power in the optical beam may decrease, due to attenuation within the tuning element, and the amplitude and/or phase profile of the beam may be changed, which is herein referred to as "distortion". This distortion and attenuation will depend on the transmitted wavelength. Note that an SDSF tuning element as defined here is not obviously a suitable tuning element for a laser, since an SDSF tuning element typically acts as a notch filter in isolation, and laser tuning requires a bandpass filter.

SUMMARY OF THE INVENTION

The name given to our novel tuning mechanism, "spectrally dependent spatial filtering" refers to spectrally dependent beam distortion in a laser cavity where an intra-cavity spatial filter is present to make the round trip cavity loss a sensitive function of beam distortion and cavity alignment. In this manner, a tunable, intracavity bandpass filter is created which tunes the laser. In the zeroth order AOTF laser, the AOTF in zeroth order transmission is an SDSF tuning element, and the requirement of mode matching between the return beam and the gain medium waveguide mode provides a spatial filter. Of course, other kinds of spatial filter, such as a pinhole, can also be used as part of the SDSF tuning mechanism.

Consider a laser with an intra-cavity spatial filter and an SDSF tuning element, aligned for maximum output power when the distortion is zero, (laser A). For laser A, it is clear that the introduction of any beam distortion will necessarily increase round trip cavity loss. Typically, an SDSF tuning element only distorts the beam significantly over a limited range of wavelengths centered at some central wavelength $\lambda_c$. Therefore, the round trip loss will be approximately constant (and minimal) for all wavelengths that are sufficiently far from $\lambda_c$, and the round trip loss will increase as the wavelength approaches $\lambda_c$. Such a loss versus wavelength dependence will not tune the laser, since no intracavity bandpass filter is present.

Now consider the same laser, except that the cavity alignment differs from the alignment needed to obtain maximum output power for no distortion, (laser B). In this situation, the round trip loss versus wavelength dependence is still roughly constant for all wavelengths that are sufficiently far from $\lambda_c$, but this constant "background" loss is no longer minimal, because the loss has been increased from the background loss present in laser A as a result of the cavity alignment of laser B. Thus, in the case of laser B, the SDSF tuning element can reduce the round trip cavity loss to a level that is less than the background loss, at least for some wavelengths, and furthermore the round trip cavity loss can be minimal for a wavelength $\lambda_0$ near the center wavelength $\lambda_c$. This wavelength of minimal round trip loss, at which laser emission will occur, can be varied by tuning the center wavelength of the SDSF tuning element with appropriate control inputs, such as an electrical frequency or voltage. In laser B, the alignment is such that a tunable intra-cavity bandpass filter is created by the SDSF tuning element.

It is well known that the round trip loss in a laser cavity without an intra-cavity spatial filter is substantially insensitive to beam distortion and small perturbations to the cavity alignment. Thus, the purpose of the intra-cavity spatial filter in the present invention is to strengthen (i.e. increase the difference between minimum loss and "background" loss for laser B) the intra-cavity bandpass filtering effect disclosed above, by making the cavity round trip loss a more sensitive function of beam distortion and cavity alignment. Although it is theoretically possible that adequate laser tuning may be obtained via this mechanism in the absence of a spatial filter, it is believed that in practice an intra-cavity spatial filter is necessary in order to obtain the broad tuning range (e.g. ≧30 nm) that is desirable for most applications. Detailed discussion of the operation of this tuning mechanism is provided in connection with a description of the drawings.

DETAILED DESCRIPTION OF THE DRAWINGS

Figure 1:
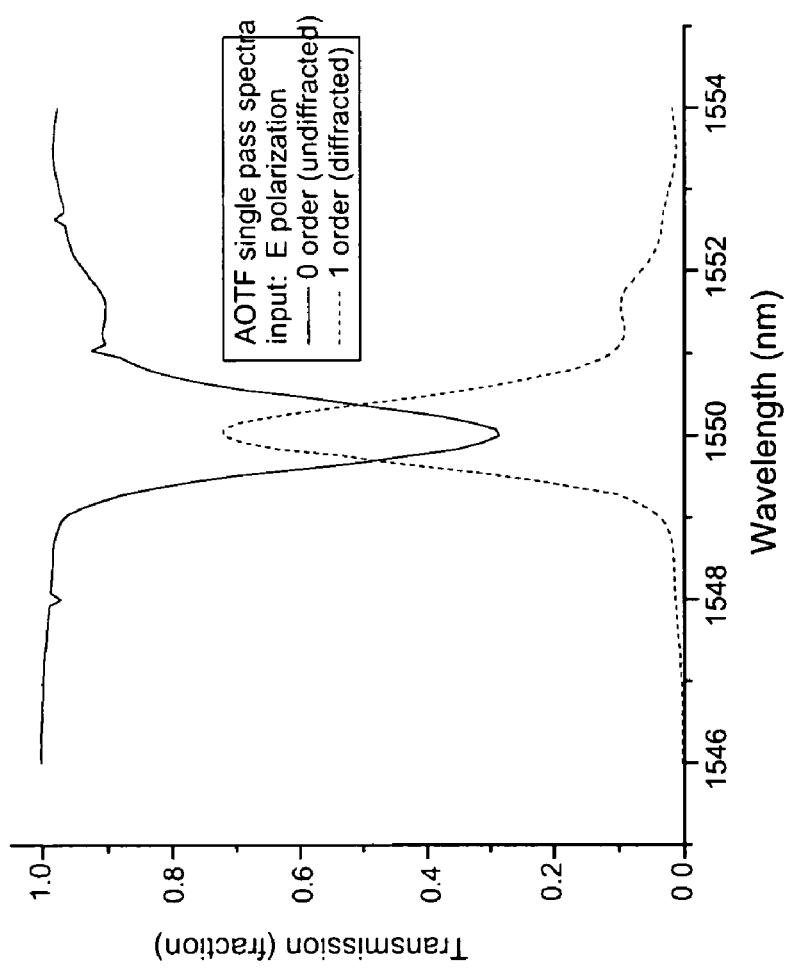
FIG. 1 shows measured single pass filtering properties of an AOTF for both zeroth order and first order transmission.

FIG. 1 shows measured spectra for single pass zeroth order and first order transmission through an AOTF. This AOTF is a non-collinearly phase-matched device, so there is a clear distinction between the zeroth order light path through the device and the first order light path through the device, based on the diffraction angle between zeroth order output and first order output. Note that the AOTF functions as a notch filter (i.e. high transmission at all wavelengths except for a narrow wavelength band centered on a tunable center wavelength $\lambda_c$) in zeroth order transmission, as seen in FIG. 1. The center wavelength $\lambda_c$ of the zeroth order notch is varied by changing the RF frequency applied to the AOTF, and the depth of the notch can be varied by changing the RF power applied to the AOTF. Approximately 50 mW of RF power was applied to the AOTF in this measurement. If no RF power is applied to the AOTF, there is no filtering action, and the zeroth order beam is not filtered or distorted by the AOTF.

Figure 2:
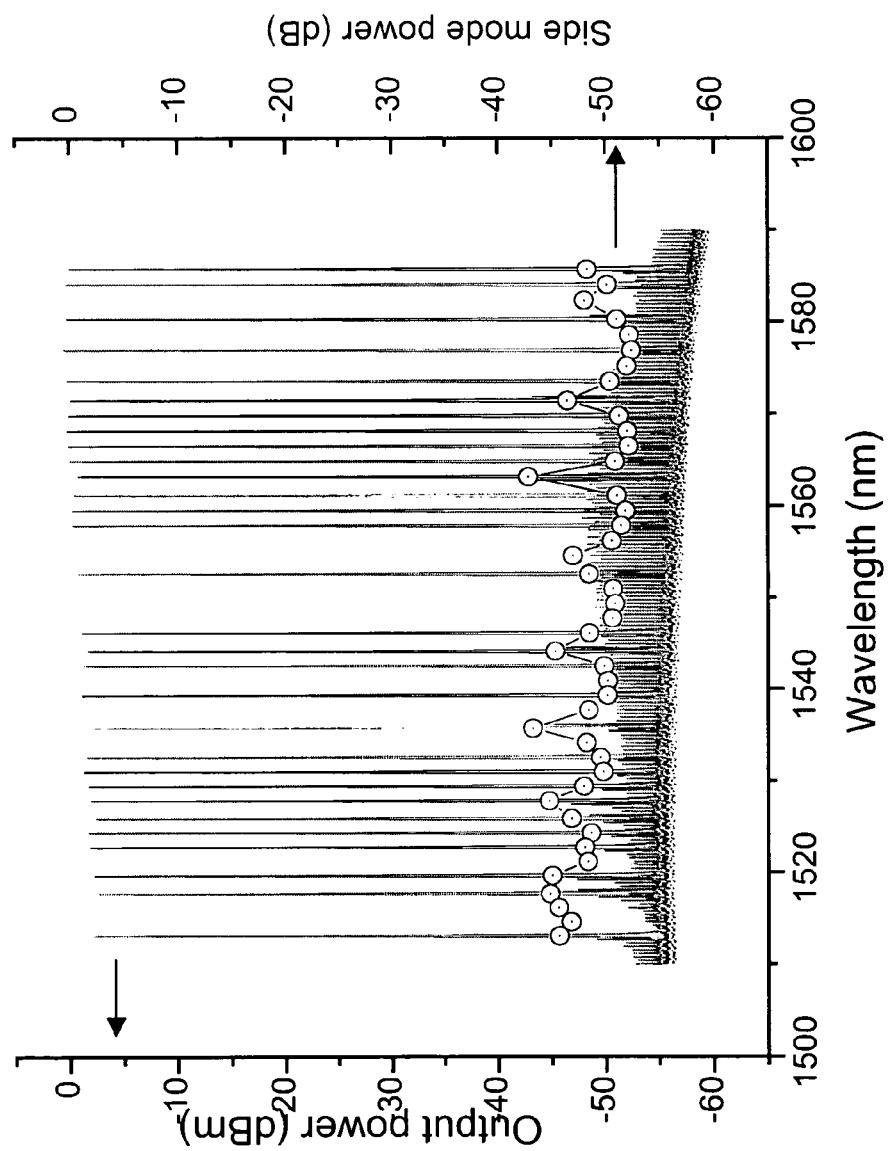
FIG. 2 shows the output power, and side mode power as a zeroth order AOTF laser is tuned over a broad wavelength range (>70 nm). The peaks give output power, and refer to the left vertical axis on the figure, and the circles give side mode power and refer to the right vertical axis on the figure.

FIG. 2 shows output power and side mode power at various wavelengths obtained from a zeroth order AOTF laser. A common measure of the spectral purity of a laser is the side mode suppression ration (SMSR), which is the ratio of the output power to the side mode power. FIG. 2 demonstrates broad tunability (>70 nm), high spectral purity (SMSR>40 dB in all cases, and typically SMSR>45 dB), and good output power uniformity across the tuning range. The zeroth order AO tuning element in this laser functions as the SDSF tuning element as defined above, and it is experimentally confirmed that laser tuning is only obtained when the zeroth order AOTF laser cavity is misaligned from the condition of maximum output power with no RF applied to the AOTF (i.e. no beam distortion).

Figure 3:
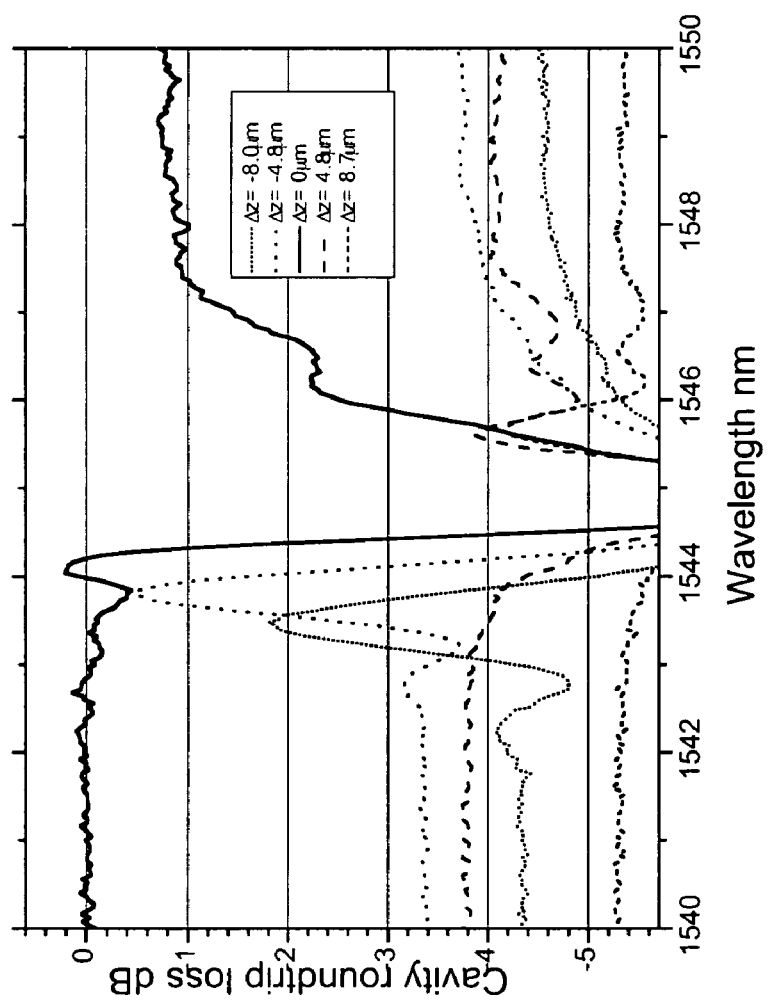
FIG. 3 gives measured round trip cavity loss for the zeroth order AOTF laser as the external cavity collimation lens is translated along the cavity axis, for a laser configuration shown schematically in FIG. 4.

FIG. 3 shows measured round trip cavity loss for a zeroth order AOTF laser, and provides clear experimental evidence for the SDSF mechanism. The results were obtained from an experiment where the drive current to the gain chip was set slightly below laser threshold. The resulting broadband amplified spontaneous emission acts as a probe to measure the intra-cavity round trip loss. The cavity configuration for this experiment comprised a lens to collimate the beam emitted from the chip, plus a planar external mirror to provide feedback. The AOTF is located between the lens and the external mirror.

The cavity alignment is systematically varied by moving the lens along the cavity axis in small displacements $\Delta z$. The $\Delta z=0$ reference point is where maximum output power is obtained with no RF power applied to the AOTF. Thus, the laser with $\Delta z \neq 0$ is a particular case of laser A, with no intentional cavity misalignment, and lasers with $\Delta z \neq 0$ are particular cases of laser B, with intentional cavity misalignment. The 0 dB loss shown on FIG. 3 is the round trip cavity loss when no power is applied to the AOTF.

For zero displacement, ($\Delta z=0$), only the expected spectral notch appears in FIG. 3. Note that the large loss within the notch is cut off by the vertical scale on the plot, which is chosen to best illustrate the SDSF effect. For $\Delta z \neq 0$, two effects are seen. First, the background loss increases as $|\Delta z|$ increases from 0. Second, a round trip spectral bandpass filtering behavior is observed for certain nonzero values of $\Delta z$, and the height of the bandpass peak relative to the background level is a sensitive function of the misalignment $\Delta z$. This intra-cavity filter is seen to be quite strong, since the $\Delta z=-4.8$ $\mu$m case plotted in FIG. 3 shows a peak height of more than 2 dB relative to the background level. An important observation to make regarding FIG. 3 is that, in situations where a significant bandpass filtering behavior is observed, the minimum round trip loss at the spectral peak is less than the round trip loss determined by the cavity misalignment alone (i.e. the background loss).

Thus, FIG. 3 shows that the beam distortion introduced by the AOTF in zeroth order transmission most nearly compensates for the cavity misalignment at a definite, tunable wavelength, and that the SDSF mechanism is therefore responsible for the tunability of the zeroth order AOTF laser. For the zeroth order AOTF laser, the spectrally dependent distortion is provided by the AOTF in zeroth order transmission, and the spatial filter is provided by the optical waveguide present in the gain medium. That is, if a certain power $P_b$ impinges on the waveguide endface, only some lesser amount of power $P_0$ is launched (i.e. coupled) into the waveguide, and the mode matching efficiency $\eta=P_0/P_b$ is a sensitive function of wavelength. We refer to loss incurred in this manner as mode matching loss.

Figure 4:
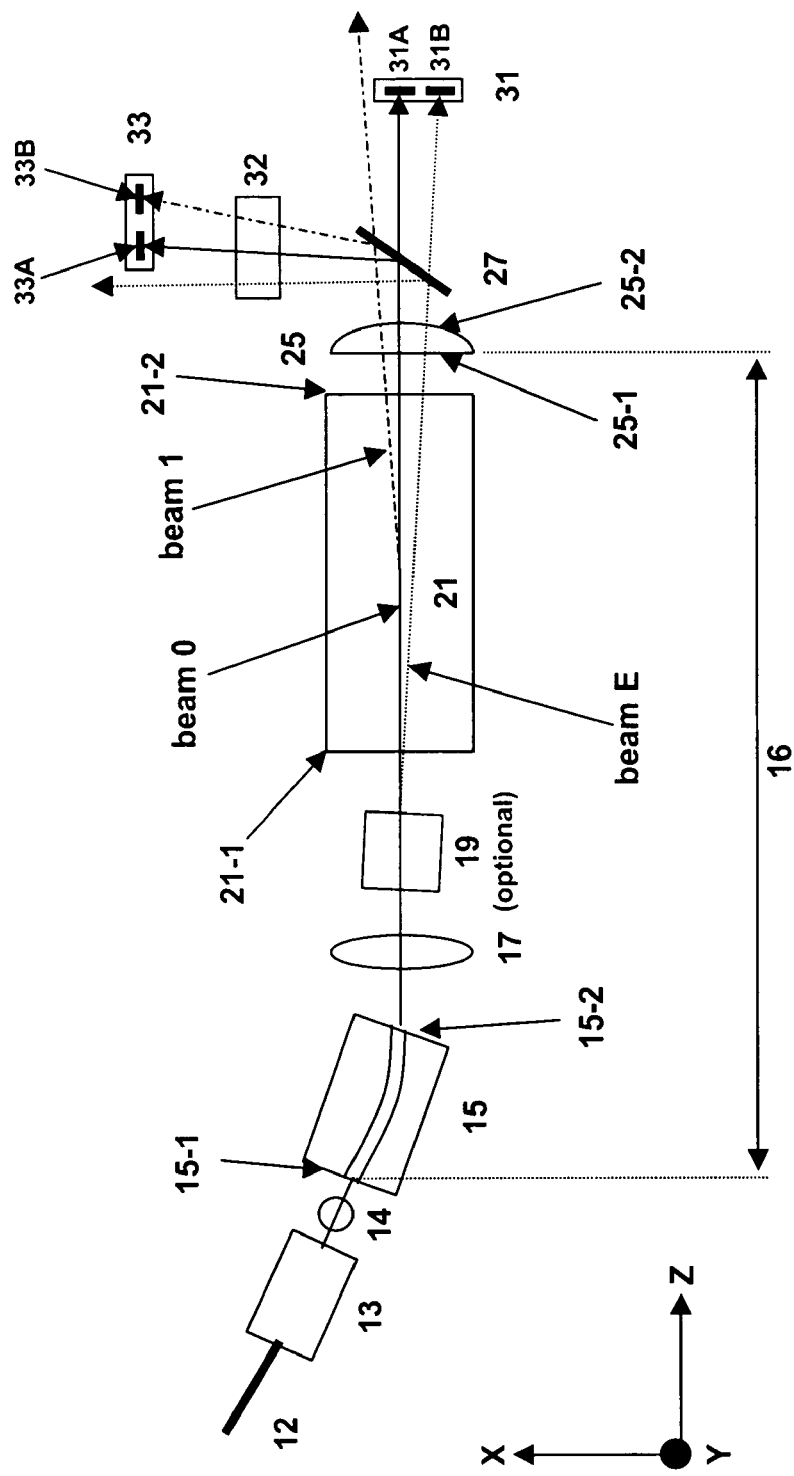
FIG. 4 shows a schematic block diagram of an embodiment of the invention

FIG. 4 is a schematic view of a tunable laser system 11, constructed according to one embodiment of the invention. Laser emission from a first face 15-1 of an electrically pumped semiconductor gain chip 15, which provides optical gain predominantly for TE polarization due to the use of compressively strained quantum wells in the chip active region, is collected by a ball lens 14, passes through an isolator and fiber coupling lens assembly 13 and is coupled to the output optical fiber 12. The first face 15-1 of the gain chip 15 thus acts as the output coupler for this laser cavity. Inside the laser cavity 16, the beam exits from the semiconductor chip 15, with approximate horizontal and vertical beam divergences of 30 degrees and 35 degrees respectively (full angle half-maximum of intensity), at a second face 15-2, which is coated and tilted to provide a reduced reflectivity endface, and passes through a collimation lens 17, having a focal length of 2.75 mm. The collimated beam is then received by a grid-fixing etalon 19(optional), whose properties and purpose are explained hereinafter. The etalon 19(optional) is present in a preferred embodiment to realize certain advantages detailed below, but is not required to implement the SDSF tuning mechanism.

The beam exiting the etalon 19 is received by an AOTF 21, at a first surface 21-1, which is preferably coated with an anti-reflection (AR) coating, preferably having a reflectivity no higher than about 0.1 percent. A suitable AOTF 21 is CBAOTF model #F101B from Aurora Photonics, which has a specified spectral bandwidth of $\leq$ 0.7 nm full width half maximum, and is typically driven by 50–100 mW of RF power. It is expected that other AO devices than CBAOTF model #F101B will perform at least equivalently as a laser tuning element. Within the AOTF 21, the laser beam propagates in the zeroth order (beam 0 in FIG. 4), and a first order beam (beam 1 in FIG. 4) is generated by diffraction and propagates in a slightly different direction. These two beams are received at spaced apart locations and angular orientations at a second surface 21-2 of the AOTF. The surface 21-2 is preferably AR-coated to reduce reflection to a negligible level (e.g., 0.1 percent).

Beams 0 and 1 are both received by a mirror/lens assembly 25, at a first surface 25-1, where this surface is coated for high reflectivity (e.g. preferably 99%). The surface 25-1 is the mirror that defines the external laser cavity and is aligned so that only beam 0 is retroreflected into the laser cavity 16. The angular and spatial separation of beam 0 and beam 1 is sufficient to ensure beam 1 is not retroreflected into the laser cavity 16. The laser cavity 16 includes all elements between the surface 15-1 of the gain chip 15 and the surface 25-1 inclusive.

The surface 25-1 has a specified level of transmission (e.g. approximately 1 percent), so that a known small fraction of various intracavity optical beams passes through surface 25-1 to be received by diagnostic elements (elements 27 through 33 inclusive). There are three beams of interest for the diagnostics. The first two of these three beams are beams 0 and 1, the zeroth order and first order beams respectively. A third beam, called "beam E", is the beam (dotted line on FIG. 4) that is generated by reflection of the circulating laser beam from the etalon 19. The etalon 19 is tilted with respect to the cavity axis, so beam E propagates in a different direction from beam 0, as indicated, and is not retroreflected back into the laser cavity 16 by the mirror 25-1.

Beams 0, 1 and E are received by a second surface 25-2, of the mirror/lens assembly 25, which is coated for low reflectivity (e.g. $\leq$0.1 percent), and is curved to provide the appropriate focusing power into diagnostic elements 27–33 inclusive. Beams 0, 1 and E are then received by a beam splitter 27, which directs roughly half the power in each of the three beams toward a first detector array 31 (beams 0*a*, 1*a* and E*a*) and toward a second detector array 33 (beams 0*b*, 1*b* and E*b*).

Beams 0*a* and E*a* are received by two detector elements, e.g. 31A and 31B respectively, in the detector array 31. In addition, beam 1*a* misses all the elements of detector array 31, as indicated. Beams 0*b*, 1*b* and 2*b* are received by a linear transmission filter (LTF) 32. The LTF attenuates each beam by a factor that is a linear function of wavelength. Beams 0*b* and 1*b*, upon transmission through LTF 32, are received by two detector elements, e.g. 33A and 33B respectively, of detector array 33. In addition, beam E*b* misses all elements of detector array 33, as indicated.

With this arrangement, three control signals are obtained. The first control signal is the ratio of beam 0*b* at 33A to beam 0*a* at 31A. This ratio provides a direct measure of the emission wavelength of the laser, because the LTF 32 is in the optical path leading to detector array 33. The second control signal is the ratio of beam 1b at 33B to beam 0b at 33A of detector array 33. This ratio is a sensitive function of the location of the laser wavelength with respect to the zeroth order spectral notch of the AOTF, and can be used as an input to an appropriate control loop to keep the AOTF tuning element from drifting with respect to the lasing mode. This second control signal is not affected by the presence of the LTF 32 in the optical path leading to detector array 33, since the LTF attenuates beams 0b and 1b by the same factor. The third control signal is the ratio of beam Ea at 31B to beam 0a at 31A of detector array 31, which is a measure of how well the lasing mode is aligned to the etalon. An appropriate control loop can use this control signal to ensure mode-hop-free operation by locking the lasing mode to the etalon.

Operation of the zeroth order AOTF laser depends on the manner in which the cavity is aligned. Although the indicated procedure below might need to be modified if the components that comprise the laser system change, those skilled in the art will be able to readily carry out appropriate alignment procedures. The alignment procedure that was used in FIG. 4 comprised the following steps:

1) Align laser for maximum output power with only chip, lens and back mirror in place (i.e. elements 15, 17 and 25-1 respectively in FIG. 4).
2) Insert AOTF (element 21 in FIG. 4) into cavity with no RF power applied to the AOTF. The AOTF is a non-collinearly phase matched device, and is inserted such that the relevant optical and acoustic wave vectors all lie in the X-Z plane of FIG. 4. Adjust the AOTF so that the beam hits the back mirror at the same vertical (i.e. Y direction on FIG. 4) height as before.
3) Translate back mirror horizontally (i.e. X direction on FIG. 4) to center mirror on the beam. This step is necessary due to a roughly 3 mm beam walkoff due to the birefringence of the $TeO_2$ crystal used in this AOTF. The laser output power does not change appreciably when steps 2 and 3 are performed.
4) Apply RF power to the AOTF and choose an RF frequency such that the zeroth order AOTF filter notch is on the blue (i.e. shorter wavelength) side of the observed spectral peak of the broadband laser emission.
5) Translate the lens 17 along the cavity axis (i.e. Z direction on FIG. 4), and/or change tilt of back mirror 25-1, until a transition from broadband lasing emission far from the AOTF notch to single mode lasing emission at an edge of the AOTF notch is observed.
6) Systematically and sequentially adjust lens 17 position (X, Y and Z), mirror 25-1 tilt (towards X and Y) and AOTF 21 position (X and Y) to maximize wavelength range in which single-mode tunable lasing is observed. Such systematic adjustment procedures are well know to those skilled in the art.
7) Insert grid fixing etalon 19 and repeat step 6.

Figure 5:
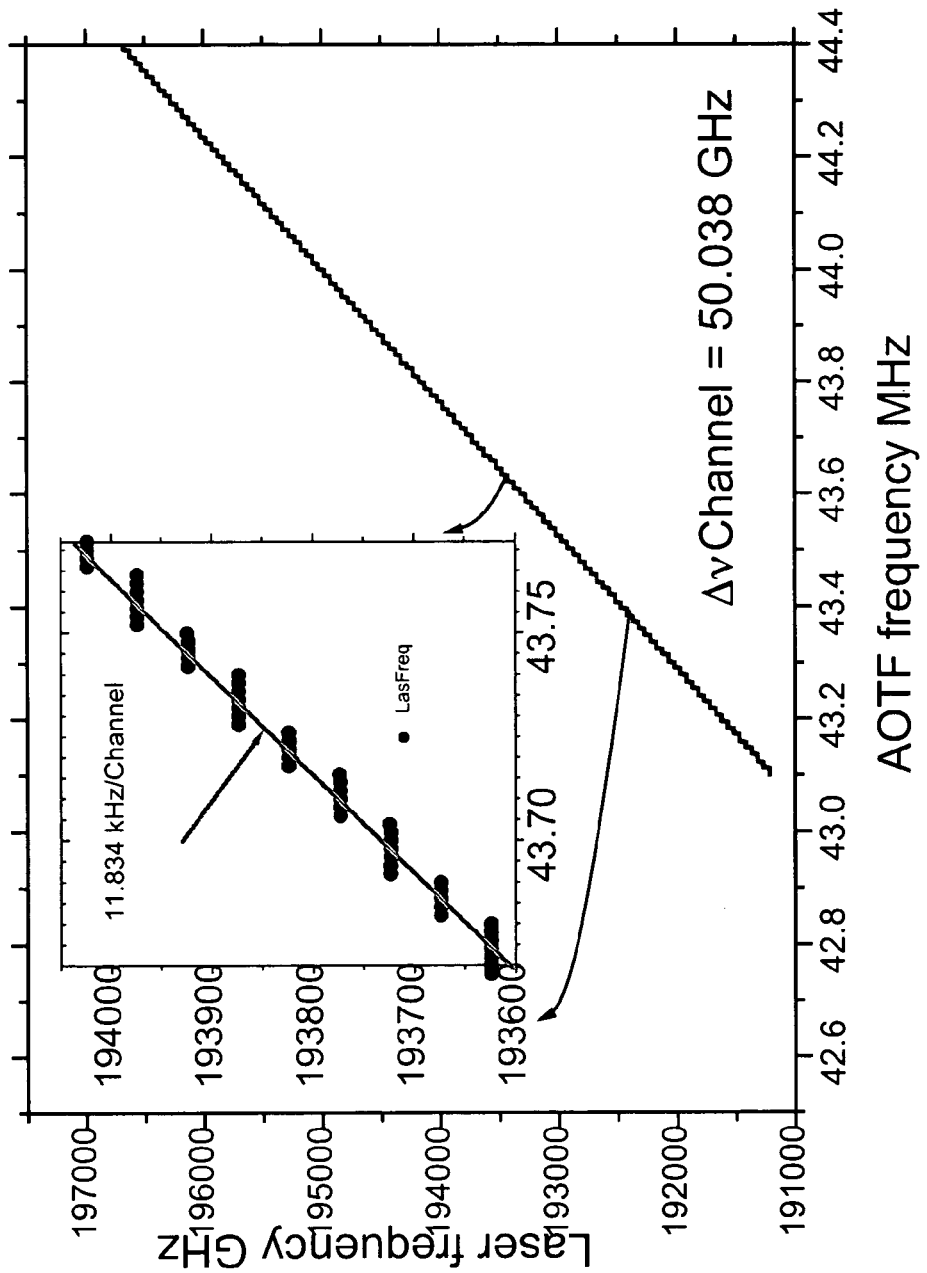
FIG. 5 gives a typical tuning curve for a zeroth order AOTF laser with an intracavity grid fixing etalon.
Figure 6:
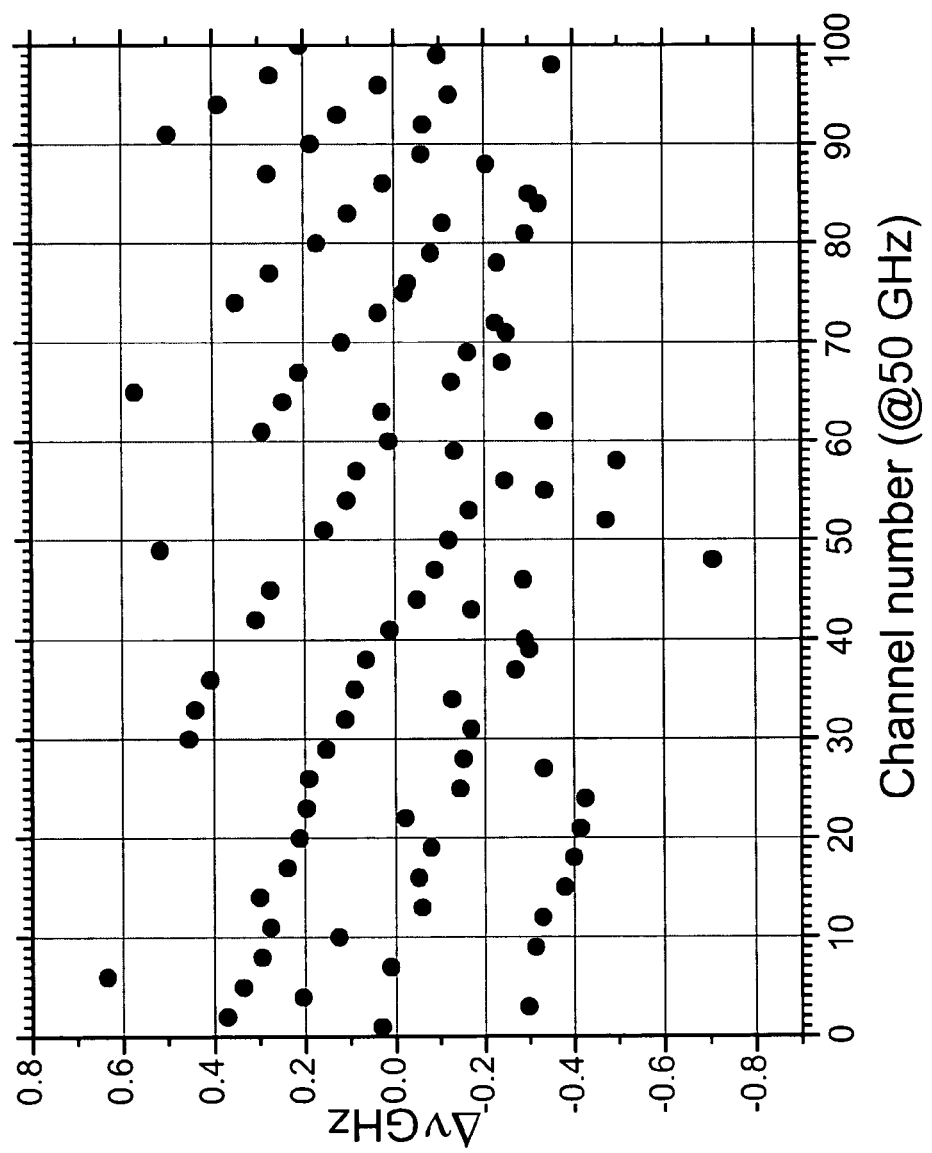
FIG. 6 shows the accuracy with which the open loop laser frequencies were placed on a 50 GHz grid using a zeroth order AOTF laser with an intracavity grid fixing etalon.
Figure 7:
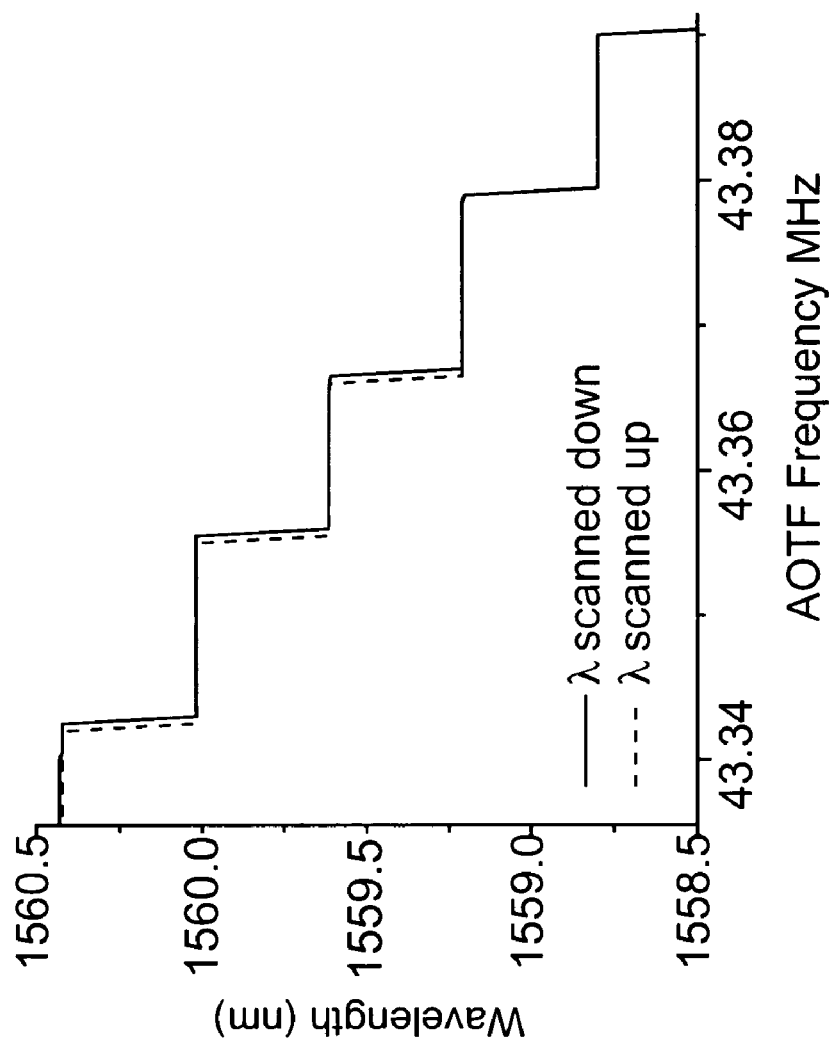
FIG. 7 shows that there is negligible hysteresis as the laser wavelength is moved up, then down for a zeroth order AOTF laser with an intracavity grid fixing etalon.

The function of the grid fixing etalon 19 in FIG. 4 can be appreciated by considering FIGS. 5, 6 and 7, which all pertain to a zeroth order AOTF laser with a grid fixing etalon inserted within the cavity. FIG. 5 gives a typical tuning curve, where the presence of the grid fixing etalon causes the laser to tune in discrete steps as the RF frequency applied to the AOTF is swept. The reason for this is that the etalon introduces a high intracavity loss at all wavelengths except at its transmission peaks. Therefore, the laser can lase only at or very near an etalon transmission peak, and the spacing between the wavelength steps is determined by the etalon free spectral range, e.g. 50 GHz. FIG. 6 shows that excellent open loop wavelength accuracy is obtained in practice, where the deviations from an exact 50 GHz grid are less than 1 GHz over a total range of 100 channels (i.e. 5 THz). FIG. 7 shows a small portion of the tuning curve, where the RF frequency is first swept up, then swept down. Hysteresis in the tuning curve is seen to be essentially negligible.

The presence of a grid fixing etalon within a tunable laser, such as the zeroth order AOTF laser, provides nonobvious advantages for applications where the laser is required to tune to channels that lie on a fixed, evenly spaced, frequency grid. The dense wavelength division multiplexing (DWDM) application is a primary example of such an application, where the ITU grid is the relevant fixed frequency grid. In some DWDM applications, such as sources for test equipment, the open loop wavelength accuracy provided by the grid fixing etalon can provide the required accuracy. In these cases, the use of a grid fixing etalon allows the wavelength control loop that is typically necessary in such sources to be eliminated, which is clearly advantageous. For other DWDM applications, such as sources for optical communication, the use of a grid fixing etalon may not permit elimination of the wavelength control loop. In such cases, the presence of a grid fixing etalon still provides advantages, such as reduced total size and part count (relative to a laser+external locker configuration), and greater flexibility in overall laser control, since wavelength accuracy is ensured with a stable, passive intracavity device.

In order to perform its intended function, the grid fixing etalon 19 in FIG. 4 is preferably inserted into the laser cavity 16 such that the etalon surface normals make a small angle (preferably 1–10 degrees) with respect to the cavity axis, to thereby ensure that the beams reflected from the etalon surfaces do not efficiently couple into the laser cavity. The etalon finesse is moderate (e.g. 2<finesse<10), and this value of finesse is chosen to provide low loss in transmission through the tilted etalon, and the desired level of spectral selectivity. Since the etalon serves as an absolute wavelength reference for the laser, the etalon is preferably fabricated using materials, such as fused silica, that are mechanically stable and temperature insensitive.

Note that, as previously indicated, implementation of the basic SDSF tuning mechanism does not require the use of a grid fixing etalon. The embodiment of a laser based on the SDSF tuning mechanism, i.e. the zeroth order AOTF laser which has been described in detail, has a grid fixing etalon inserted into the cavity to realize the indicated additional advantages that are over and above those of the laser tuning mechanism.

Many of the advantages that are provided by insertion of a grid fixing etalon within a tunable laser can be achieved using similar methods, such as by appropriately engineering a parasitic etalon that is already present within the cavity (e.g. an etalon formed by the two faces of a semiconductor gain chip) to perform the grid fixing function. It is also possible to use the overall optical path length of the laser cavity to perform the grid fixing function, since the longitudinal mode spacing of a laser is determined by the round trip optical path length. In general, we refer to such lasers as featuring "discrete tunability".

As is evident from the preceding description, the present invention provides a novel laser and laser tuning mechanism, of which a preferred embodiment is the zeroth order AOTF laser. As such, it will be apparent to one skilled in the art that various modifications to the details of construction and method shown here may be made without departing from the scope of the invention, e.g. folding the optical path within the laser cavity and/or tuning element in order to make the laser more compact. The application of well known laser engineering principles to lasers which tune via the disclosed mechanism fall within the scope of the present invention, since such application would constitute an obvious combination of engineering prior art with the novel laser tuning mechanism herein disclosed.

It will also be apparent to those skilled in the art that the operating principles that govern the selection of a single oscillation frequency for the tunable laser can also be employed to obtain non-tunable single frequency operation of a laser. For example, a static volume hologram in zeroth order transmission is a suitable wavelength determining element for this application.

What is claimed is:

1. A laser formed by an optical resonator comprising:
   a) an electrically pumped semiconductor gain medium comprising a single-mode optical waveguide having first and second endfaces, where said first endface is an output coupler of said optical resonator, from which a beam with total power $P_a$ is emitted from said second endface;
   b) a lens which receives said emitted beam and transmits it to;
   c) an acousto-optic device which receives said transmitted beam, wherein said received beam is distorted and attenuated, but not frequency shifted, in the course of transmission through the acousto-optic device, and wherein the extent of the distortion and attenuation is dependent on the received beam wavelength and the RF frequency applied to the acousto-optic device; and
   d) a return mirror which reflects said non frequency-shifted beam back through said acousto-optic device and said lens;
   whereby said reflected beam impinges on said second endface with a total power $P_b$, with a lesser optical power $P_0$ being launched into the gain medium waveguide, such that $P_0/P_a$ has a maximum value at a wavelength $\lambda_0$ where the total loss due to mode mismatching and attenuation in the external cavity is minimized, where $\lambda_0$ is selected by said acousto-optic device in response to the RF frequency applied to said acousto-optic device,
   and wherein $\lambda_0$ is the wavelength of laser emission from said first endface.

2. The laser of claim 1 wherein said optical resonator also contains a grid fixing etalon.

3. The laser of claim 1 where discrete tunability is achieved by adjusting the round trip optical path length of said optical resonator.

4. A laser formed by an optical resonator comprising:
   a) a pumped gain medium comprising a single-mode optical waveguide having first and second endfaces, where said first endface is an output coupler of the optical resonator, from which a beam with total power $P_a$ is emitted from said second endface;
   b) coupling optics which receive the beam emitted from said second endface and transmit it to;
   c) a spectrally dependent spatial filtering (SDSF) tuning element which receives said transmitted beam, and which allows said received beam to exit from the tuning element as a beam that is attenuated and distorted without a frequency shift, wherein the extent of the attenuation and distortion depends on said received beam wavelength, and wherein said SDSF tuning element includes control means to alter the wavelength dependence of the beam distortion and attenuation;
   d) a return mirror which reflects said distorted and attenuated beam back through said tuning element and said coupling optics;
   whereby said reflected beam impinges on said second endface with a total power $P_b$, with a lesser power $P_0$ being launched into the gain medium waveguide, such that $P_0/P_a$ has a maximum value at a wavelength $\lambda_0$ where the total loss due to mode mismatching and attenuation in the external cavity is minimized, where $\lambda_0$ is selected by said tuning element,
   and wherein $\lambda_0$ is the laser emission wavelength from said first endface.

5. The laser of claim 4 wherein three wave mixing occurs in said SDSF tuning element, and said SDSF tuning element is aligned such that no frequency shift is incurred in transmission through said element.

6. The laser of claim 4 wherein said optical resonator also contains a grid fixing etalon.

7. The laser of claim 4 where discrete tunability is achieved by adjusting the roundtrip optical path length of said optical resonator.

8. A laser formed by an optical resonator comprising:
   a) a pumped gain medium;
   b) a spectrally dependent spatial filtering (SDSF) tuning element, which allows said incident beam to exit from the tuning element as a beam that is attenuated and distorted without a frequency shift, wherein the extent of the attenuation and distortion depends on said incident beam wavelength, and wherein said SDSF tuning element includes control means to alter the wavelength dependence of the beam distortion and attenuation; and
   c) a spatial filter;
   such that the total round trip loss attains a minimum value at a wavelength $\lambda_0$ selected by said tuning element, whereby $\lambda_0$ is the laser emission wavelength.

9. The laser of claim 8, wherein said SDSF tuning element is a volume hologram, aligned such that the propagation direction of the laser beam within said optical resonator is nominally unchanged in transmission through said hologram at $\lambda_0$.

10. The laser of claim 8 wherein three wave mixing occurs in said SDSF tuning element, and said SDSF tuning element is aligned such that no frequency shift is incurred in transmission through said element.

11. The laser of claim 10 where the three wave mixing interaction is an acousto-optic interaction and wherein said SDSF tuning element is an acousto-optic tunable filter.

12. The laser of claim 8 wherein said optical resonator also contains a grid fixing etalon.

13. The laser of claim 8 where discrete tunability is achieved by setting the round trip optical path length of said optical resonator.

14. A method for generating a tunable laser beam comprising:
   a) pumping a gain medium positioned within an optical resonator to thereby generate an optical beam;
   b) passing the beam through a spectrally dependent spatial filtering (SDSF) tuning element within said optical resonator;
   c) passing the beam through a spatial filter within said optical resonator;
   d) distorting and attenuating the beam passing through said SDSF tuning element in accordance with a beam distortion and attenuation control signal, such that the total round trip loss within said optical resonator is minimal at a wavelength $\lambda_0$;

e) emitting laser radiation having a wavelength $\lambda_0$ from an output coupler within said optical resonator; and f) tuning the wavelength of said laser beam by selecting $\lambda_0$ by said SDSF tuning element in response to the beam distortion and attenuation control signal.

15. The method of claim 14 wherein said SDSF tuning element is a volume hologram, aligned such that the propagation direction of the laser beam within said optical resonator is nominally unchanged in transmission through said hologram at $\lambda_0$.

16. The method of claim 14 wherein three wave mixing occurs in said SDSF tuning element, and said SDSF tuning element is aligned such that no frequency shift is incurred in transmission through said element.

17. The method of claim 16 where the three wave mixing interaction is an acousto-optic interaction and wherein said SDSF tuning element is an acousto-optic tunable filter.

18. The method of claim 14 further comprising:

g) inserting a secondary output coupler into said optical resonator such that a fraction of the circulating laser beam within said optical resonator is emitted from said secondary output coupler;

h) dividing said emitted beam into a first sub-beam in a first optical path, and a second sub-beam in a second optical path;

i) filtering said second sub-beam with a linear transmission filter placed in said second optical path to produce a filtered second sub-beam; and j) determining relative beam intensities of said first sub-beam in said first optical path and said second filtered sub-beam in said second optical path in order to measure the laser emission wavelength.

19. The method of claim 14 further comprising:

g) inserting a secondary output coupler into said optical resonator such that a fraction of the circulating laser beam within said optical resonator is emitted as a first beam from said secondary output coupler, and such that a fraction of the diffracted beam generated within said SDSF tuning element is emitted as a second beam from said secondary output coupler; and h) determining relative beam intensities of said first beam and said second beam in order to measure the difference between the laser emission wavelength and the center wavelength of the zeroth order spectral notch of said SDSF tuning element.

20. The method of claim 14 further comprising:

g) inserting a grid fixing etalon into said optical resonator in order to provide discrete tunability;

h) inserting a secondary output coupler into said optical resonator such that a fraction of the circulating laser beam within said optical resonator is emitted as a first beam from said secondary output coupler, and such that a fraction of the beam generated within said optical resonator by reflection of the circulating laser beam from said grid fixing etalon is emitted as a second beam from said secondary output coupler; and i) determining relative beam intensities of said first beam and said second beam in order to measure the difference between the laser emission wavelength and a wavelength of the transmission peak of said grid fixing etalon.

21. A method for generating a tunable laser beam comprising:

a) pumping a gain medium positioned within an optical resonator, said gain medium comprising a single-mode optical waveguide;

b) passing the beam through a spectrally dependent spatial filtering (SDSF) tuning element within said optical resonator;

c) distorting and attenuating the beam passing through said SDSF tuning element in accordance with a beam distortion and attenuation control signal, such that the total round trip loss within said optical resonator is minimized at a wavelength $\lambda_0$;

d) emitting laser radiation having a wavelength $\lambda_0$ from an output coupler within said optical resonator; and e) tuning the wavelength of said laser beam by selecting $\lambda_0$ by said SDSF tuning element in response to the beam distortion and attenuation control signal.

22. The method of claim 21 wherein three wave mixing occurs in said SDSF tuning element, and said SDSF tuning element is aligned such that no frequency shift is incurred in transmission through said element.

23. The method of claim 21 where the three wave mixing interaction is an acousto-optic interaction and wherein said SDSF tuning element is an acousto-optic tunable filter.

24. The method of claim 21 further comprising:

f) inserting a secondary output coupler into said optical resonator such that a fraction of the circulating laser beam within said optical resonator is emitted from said secondary output coupler, g) dividing said emitted beam into a first sub-beam in a first optical path, and a second sub-beam in a second optical path, h) filtering said second sub-beam with a linear transmission filter placed in said second optical path to produce a filtered second sub-beam, i) determining relative beam intensities of said first sub-beam in said first optical path and said second filtered sub-beam in said second optical path in order to measure the laser emission wavelength.

25. The method of claim 21 further comprising:

f) inserting a secondary output coupler into said optical resonator such that a fraction of the circulating laser beam within said optical resonator is emitted as a first beam from said secondary output coupler, and such that a fraction of the diffracted beam generated within said SDSF tuning element is emitted as a second beam from said secondary output coupler; and g) determining relative beam intensities of said first beam and said second beam in order to measure the difference between the laser emission wavelength and the center wavelength of the zeroth order spectral notch of said SDSF tuning element.

26. The method of claim 21 further comprising:

f) inserting a grid fixing etalon into said optical resonator in order to provide discrete tunability;

g) inserting a secondary output coupler into said optical resonator such that a fraction of the circulating laser beam within said optical resonator is emitted as a first beam from said secondary output coupler, and such that a fraction of the beam generated within said optical resonator by reflection of the circulating laser beam from said grid fixing etalon is emitted as a second beam from said secondary output coupler; and h) determining relative beam intensities of said first beam and said second beam in order to measure the difference between the laser emission wavelength and a wavelength of the transmission peak of said grid fixing etalon.

* * * * *